United States Patent
Han et al.

(10) Patent No.: US 8,952,638 B2
(45) Date of Patent: Feb. 10, 2015

(54) CIRCUIT AND METHOD FOR DETECTING DUTY RATIO OF PWM SIGNAL

(71) Applicant: Samsung Electro-Mechanics Co., Ltd., Suwon, Gyunggi-do (KR)

(72) Inventors: Su Yeon Han, Gyunggi-do (KR); Jung Eun Youm, Gyunggi-do (KR); Bon Young Gu, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 147 days.

(21) Appl. No.: 13/829,805

(22) Filed: Mar. 14, 2013

(65) Prior Publication Data

US 2014/0117898 A1    May 1, 2014

(30) Foreign Application Priority Data

Oct. 31, 2012 (KR) .......... 10-2012-0122297

(51) Int. Cl.
*H02P 7/00* (2006.01)
*H02P 27/08* (2006.01)
*G01R 29/02* (2006.01)

(52) U.S. Cl.
CPC .... *H02P 7/00* (2013.01); *H02P 27/08* (2013.01); *G01R 29/02* (2013.01)
USPC ........... 318/400.13; 318/400.01; 318/700

(58) Field of Classification Search
CPC ............................................ H02P 7/00
USPC ................ 318/400.13, 400.01, 700
See application file for complete search history.

(56) References Cited

U.S. PATENT DOCUMENTS 7,795,826 B2 * 9/2010 Inoue ............ 318/400.03

FOREIGN PATENT DOCUMENTS

| JP | 06-091977 A | 4/1994 |
|---|---|---|
| JP | 09-271198 A | 10/1997 |
| JP | 2002-238280 A | 8/2002 |
| JP | 2004-072916 A | 3/2004 |
| JP | 2008-017648 A | 1/2008 |
| JP | 2010-273445 A | 12/2010 |
| JP | 2011-130532 A | 6/2011 |

OTHER PUBLICATIONS

Japanese Office Action, w/ English translation thereof, issued in Japanese Patent Application No. JP 2013-060294 dated Mar. 25, 2014.

* cited by examiner

*Primary Examiner* — David S Luo
(74) *Attorney, Agent, or Firm* — McDermott Will & Emery LLP

(57) ABSTRACT

There are provided a circuit and a method for detecting a duty ratio of a PWM signal. The circuit includes: a counting unit counting a PWM signal; a detection indication determining unit determining whether a detection indication signal indicating a start of detection of the duty ratio of the PWM signal has been input; an edge detecting unit detecting a preset PWM edge of the PWM signal; and a duty calculating unit calculating the duty ratio of the PWM signal using a count value during a section from a k-th point in time (T(k)) (k being a natural number of 1 or more) at which the PWM edge is detected after it is determined that the detection indication signal has been input to a k+1-th point in time (T(k+1)) at which the PWM edge is detected after it is subsequently determined that the detection indication signal has been input.

12 Claims, 3 Drawing Sheets

CIRCUIT AND METHOD FOR DETECTING DUTY RATIO OF PWM SIGNAL

CROSS-REFERENCE TO RELATED APPLICATIONS

This application claims the priority of Korean Patent Application No. 10-2012-0122297 filed on Oct. 31, 2012, in the Korean Intellectual Property Office, the disclosure of which is incorporated herein by reference.

BACKGROUND OF THE INVENTION

1. Field of the Invention

The present invention relates to a circuit and a method for detecting a duty ratio of a pulse width modulation (PWM) signal, capable of being applied to a brushless direct current (BLDC) motor and calculating a duty ratio based on a rising edge or a falling edge of the PWM signal.

2. Description of the Related Art

Generally, in a control scheme using a pulse width modulation (PWM) signal, in order to control a rotation speed of a brushless direct current (BLDC) motor, a width of the PWM signal is changed to control an average voltage of a driving voltage.

The BLDC motor may be used in various products such as a fan, a pump, servo systems of heating, ventilation and air conditioning (HVAC) blower and compressor, a traction control, a sewing machine, a treadmill, and the like.

In a driving apparatus using the PWM signal as described above, in a PWM signal having a high level or a low level, among various pieces of information included therein, a duty ratio, a ratio of the high level to one period including the high level and the low level, may be the most important. Therefore, it may be very important to accurately measure the duty ratio of the PWM signal without an error.

A scheme of detecting the duty ratio of the PWM signal according to the related art will be briefly described.

A circuit for detecting a duty ratio according to the related art may detect a detection indication signal generated for a predetermined interval of time, count the entire time (Tentire=Thigh+Tlow) until the next detection indication signal (T(k+1)) is detected when the detection indication signal (T(k)) is detected, count a high level maintaining time (Thigh) in which a high level is maintained between the two detection indication signals (T(k) and T(k+1)), and calculate a ratio of the high level maintaining time (Thigh) to the entire time (Tentire=Thigh+Tlow) using the counted value, thereby calculating a duty ratio of a PWM signal.

The duty ratio of the PWM signal is calculated with the same scheme as described above and is continuously updated during each period.

In the scheme of calculating the duty ratio of the PWM signal according to the related art as described above, even in the case in which the PWM signal is input, a PWM count register is updated for a detection indication signal.

However, since points in time at which the detection indication signal is generated and a point in time at which the high level of the PWM signal occurs may not accurately coincide with each other, the point in time at which the detection indication signal is generated may be an intermediate point between the high level and the low level of the PWM signal. In this case, an error in calculation of the duty ratio may occur at a boundary of the detection indication signal.

The lower the frequency of the PWM signal, the higher the ratio of the error as described above.

The following Related Art Document, which relates to a motor control apparatus, discloses a technical feature of calculating a duty ratio, but does not disclose a technical feature of using a detection indication signal and an edge of a PWM signal in order to detect the duty ratio.

RELATED ART DOCUMENT

Japanese Patent Laid-Open Publication No. 10-1994-91977

SUMMARY OF THE INVENTION

An aspect of the present invention provides a circuit and a method for detecting a duty ratio of a pulse width modulation (PWM) signal, capable of being applied to a brushless direct current (BLDC) motor and calculating a duty ratio based on a rising edge or a falling edge of the PWM signal.

According to an aspect of the present invention, there is provided a circuit for detecting a duty ratio of a pulse width modulation (PWM) signal, the circuit including: a counting unit counting a PWM signal; a detection indication determining unit determining whether a detection indication signal indicating a start of detection of the duty ratio of the PWM signal has been input; an edge detecting unit detecting a preset PWM edge of the PWM signal; and a duty calculating unit calculating the duty ratio of the PWM signal using a count value from the counting unit during a section from a k-th point in time (T(k)) (k indicates a natural number of 1 or more) at which the PWM edge is detected after it is determined that the detection indication signal has been input to a k+1-th point in time (T(k+1)) at which the PWM edge is detected after it is subsequently determined that the detection indication signal has been input.

The counting unit may count a high level maintaining time and a low level maintaining time of the PWM signal and provide a high level count value and a low level count value to the duty calculating unit.

The detection indication determining unit may generate an indication detection signal having a preset level when it is determined that the detection indication signal has been input and provide the generated indication detection signal to the duty calculating unit.

The edge detecting unit may detect the preset PWM edge of the PWM signal when it is determined that the detection indication signal has been input, and thus, may generate an edge detection signal having a preset level.

The PWM edge may be one of a rising edge and a falling edge of the PWM signal.

The duty calculating unit may calculate the duty ratio of the PWM signal using a high level count value and a low level count value provided from the counting unit during the section from the k-th point in time (T(k)) to the k+1-th point in time (T(k+1)).

According to another aspect of the present invention, there is provided a method for detecting a duty ratio of a PWM signal, the method including: counting a PWM signal; determining whether a detection indication signal indicating a start of detection of the duty ratio of the PWM signal has been input; detecting a preset PWM edge of the PWM signal when it is determined that the detection indication signal has been input; and calculating the duty ratio of the PWM signal using a count value from the counting of the PWM signal during a section from a k-th point in time (T(k)) (k indicates a natural number of 1 or more) at which the PWM edge is detected to a k+1-th point in time (T(k+1)) at which the next PWM edge is detected.

In the counting of the PWM signal, a high level maintaining time and a low level maintaining time of the PWM signal may be counted, and a high level count value and a low level count value maybe provided to the calculating of the duty ratio of the PWM signal.

In the determining, the counting of the PWM signal may be performed until it is determined that the detection indication signal has been input, and an indication detection signal having a preset level may be generated when it is determined that the detection indication signal has been input and the generated indication detection signal may be provided to the calculating of the duty ratio of the PWM signal.

In the detecting of the preset PWM edge, the counting of the PWM signal may be performed until the preset PWM edge of the PWM signal is detected, and an edge detection signal having a preset level may be generated when the preset PWM edge of the PWM signal is detected.

The PWM edge may be one of a rising edge and a falling edge of the PWM signal.

In the calculating of the duty ratio of the PWM signal, the duty ratio of the PWM signal maybe calculated using a high level count value and a low level count value provided from the counting of the PWM signal during the section from the k-th point in time (T(k)) to the k+1-th point in time (T(k+1)).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
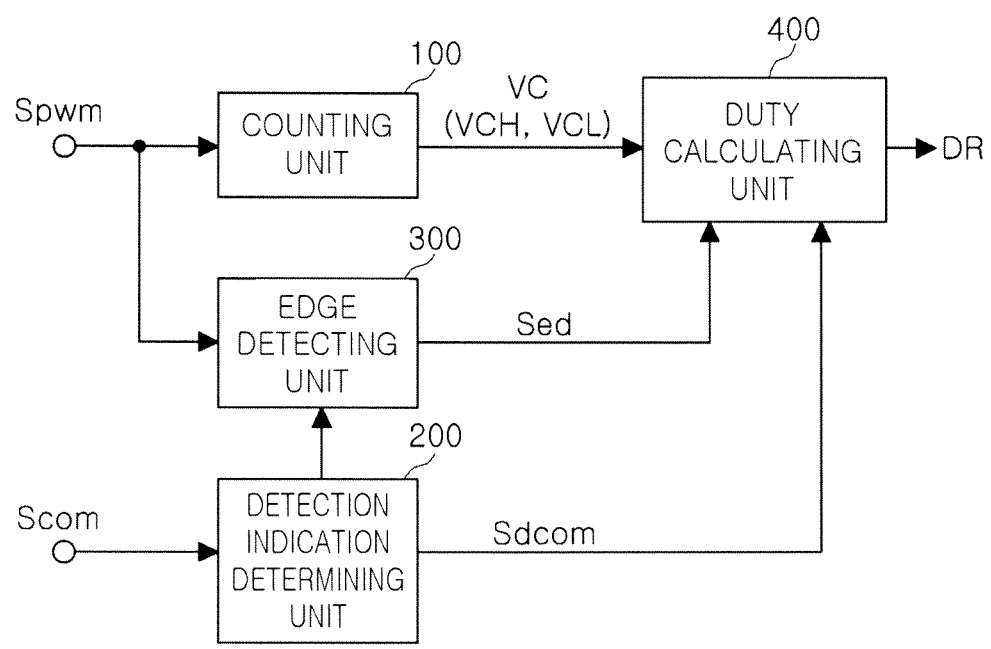
FIG. 1 is a block diagram of a circuit for detecting a duty ratio of a pulse width modulation (PWM) signal according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

FIG. 1 is a block diagram of a circuit for detecting a duty ratio of a pulse width modulation (PWM) signal according to an embodiment of the present invention.

Referring to FIG. 1, the circuit for detecting a duty ratio of a PWM signal according to the embodiment of the present invention may include a counting unit 100, a detection indication determining unit 200, an edge detecting unit 300, and a duty calculating unit 400.

The counting unit 100 may count a PWM signal Spwm and provide the count value VC to the duty calculating unit 400. The PWM signal Spwm has repeated high levels and low levels.

Here, in order to accurately control an operation of a product (for example, a motor) to which the present invention is applied, the duty ratio of the PWM signal Spwm needs to be calculated.

In addition, the counting unit 100 may count a high level maintaining time and a low level maintaining time of the PWM signal Spwm and provide a high level count value VCH and a low level count value VCL to the duty calculating unit 400.

The detection indication determining unit 200 may determine whether a detection indication signal Scom indicating a start of detection of the duty ratio of the PWM signal Spwm has been input. Here, the detection indication signal Scorn may be a signal including high level pulse signals at a preset interval of time regardless of a period of the PWM signal Spwm.

The detection indication determining unit 200 may generate an indication detection signal Sdcom having a preset level when it is determined that the detection indication signal Scom has been input, and provide the generated indication detection signal Sdcom to the duty calculating unit 400.

The edge detecting unit 300 may detect a preset PWM edge of the PWM signal Spwm. Here, the PWM edge may be one of a rising edge and a falling edge of the PWM signal Spwm.

For example, in the case in which the PWM edge is the rising edge of the PWM signal Spwm, the rising edge of the PWM signal Spwm may be a reference point in time for calculating the duty ratio. Unlike this, in the case in which the PWM edge is the falling edge of the PWM signal Spwm, the falling edge of the PWM signal Spwm may become a reference point in time for calculating the duty ratio.

In addition, the edge detecting unit 300 may detect the preset PWM edge of the PWM signal Spwm when it is determined that the detection indication signal Scom has been input, thereby generating an edge detection signal Sed having a preset level.

In addition, the duty calculating unit 400 may calculate the duty ratio of the PWM signal using the count value VC from the counting unit 100 during a section from a k-th point in time (T(k)) (k indicates a natural number of 1 or more) at which the PWM edge is detected after it is determined that the detection indication signal Scorn has been input to a k+1-th point in time (T(k+1)) at which the PWM edge is detected after it is subsequently determined that the detection indication signal Scom has been input.

The duty calculating unit 400 may calculate the duty ratio of the PWM signal by using the high level count value VCH and the low level count value VCL provided from the counting unit 100 during the section from the k-th point in time (T(k)) to the k+1-th point in time (T(k+1)).

Figure 2:
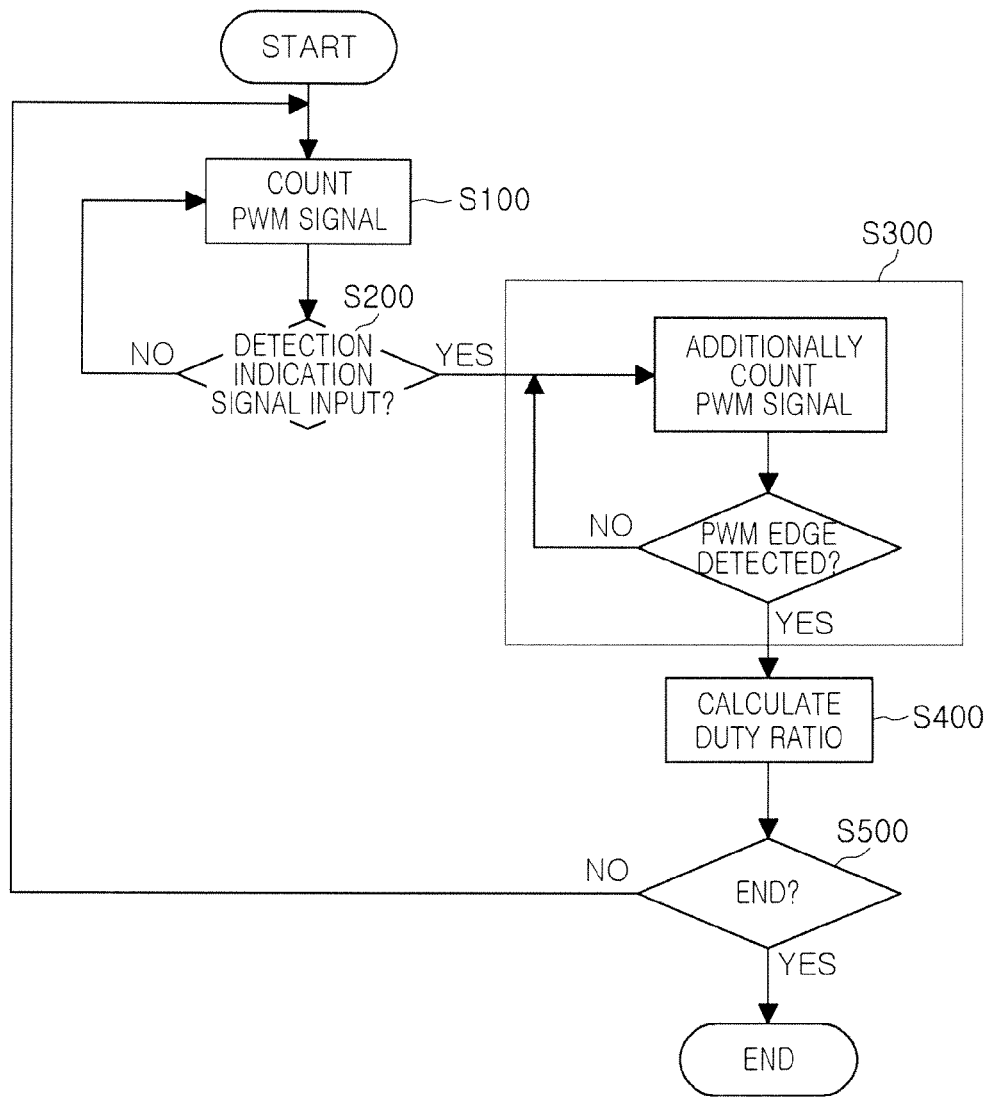
FIG. 2 is a flow chart of a method for detecting a duty ratio of a PWM signal according to the embodiment of the present invention.

FIG. 2 is a flow chart of a method for detecting a duty ratio of a PWM signal according to the embodiment of the present invention.

The method for detecting a duty ratio of a PWM signal according to the embodiment of the present invention will be described with reference to FIGS. 1 and 2. First, the counting unit 100 may count the PWM signal Spwm (S100).

In this case, the counting unit 100 may count the high level maintaining time and the low level maintaining time of the PWM signal Spwm and provide the high level count value VCH and the low level count value VCL.

The detection indication determining unit 200 may determine whether the detection indication signal Scom indicating a start of detection of the duty ratio of the PWM signal Spwm has been input (S200).

The detection indication determining unit 200 may generate the indication detection signal Sdcom having the preset level when it is determined that the detection indication signal Scom has been input and may provide the generated indication detection signal Sdcom to operation (S400) of calculating the duty ratio of the PWM signal.

Then, the edge detecting unit 300 may detect the preset PWM edge of the PWM signal Spwm when it is determined that the detection indication signal Scom has been input (S300).

In this operation (S300), the operation (S100) of counting the PWM signal may be performed until the preset PWM edge of the PWM signal Spwm is detected and the edge detection signal Sed having the preset level may be generated when the preset PWM edge of the PWM signal Spwm is detected.

The PWM edge may be one of, for example, a rising edge and a falling edge of the PWM signal Spwm.

Then, the duty calculating unit 400 may calculate the duty ratio of the PWM signal using the count value VC from the operation (S100) of counting the PWM signal during the section from the k-th point in time (T(k)) at which the PWM edge is detected to the k+1-th point in time (T(k+1)) at which the next PWM edge is detected (S400).

The duty calculating unit 400 may calculate the duty ratio (DR) of the PWM signal Spwm by using the high level count value VCH and the low level count value VCL provided from the counting unit 100 during the section from the k-th point in time (T(k)) to the k+1-th point in time (T(k+1)).

Figure 3:
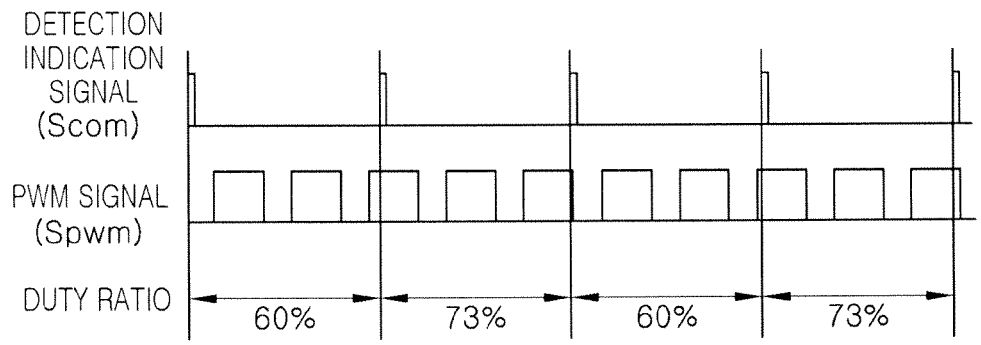
FIG. 3 is a view showing an example of calculating a duty ratio based on a detection indication signal according to the related art.

FIG. 3 is a view showing an example of calculating a duty ratio based on a detection indication signal according to the related art.

Referring to FIG. 3, in the case of calculating the duty ratio based on the detection indication signal Scom according to the related art, as shown in FIG. 3, the detection indication signal Scom and the rising edge or the falling edge of the PWM signal Spwm do not coincide with each other.

Therefore, the duty ratios calculated in respective sections are, for example, 60%, 73%, 60%, 73%, and the like, that is, the duty ratios calculated in respective sections are not constant.

Figure 4:
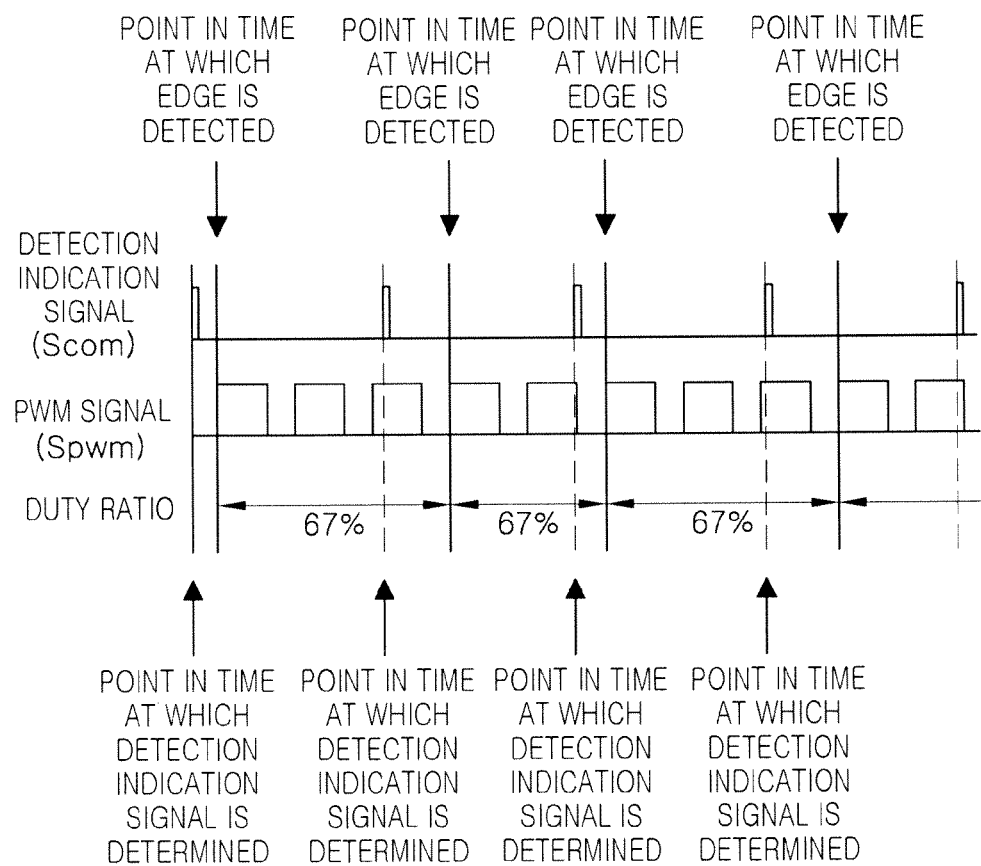
FIG. 4 is a view showing an example of calculating a duty ratio based on a detection indication signal and an edge of the PWM signal according to the embodiment of the present invention.

FIG. 4 is a view showing an example of calculating a duty ratio based on a detection indication signal and an edge of the PWM signal according to the embodiment of the present invention.

Referring to FIG. 4, in the case of calculating the duty ration of the PWM signal Spwm based on the detection indication signal Scom and the PWM edge according to the embodiment of the present invention, after it is determined that the detection indication signal Scom has been input, the PWM edge is again detected, and the duty ratio is calculated based on the PWM edge.

Therefore, it may be appreciated that a constant duty ratio of, for example, 67% may be calculated.

As set forth above, according to the embodiments of the present invention, the circuit and the method for detecting a duty ratio of a PWM signal as described above may be applied to a brushless direct current (BLDC) motor, and a duty ratio based on a rising edge or a falling edge of the PWM signal may be calculated to more accurately detect the duty ratio. Therefore, the circuit and the method for detecting a duty ratio of a PWM signal as described above may more accurately control a corresponding load (for example, a motor) in a system to which they are applied.

While the present invention has been shown and described in connection with the embodiments, it will be apparent to those skilled in the art that modifications and variations can be made without departing from the spirit and scope of the invention as defined by the appended claims.

What is claimed is:

1. A circuit for detecting a duty ratio of a pulse width modulation (PWM) signal, the circuit comprising:
 a counting unit counting a PWM signal;
 a detection indication determining unit determining whether a detection indication signal indicating a start of detection of the duty ratio of the PWM signal has been input;
 an edge detecting unit detecting a preset PWM edge of the PWM signal; and
 a duty calculating unit calculating the duty ratio of the PWM signal using a count value from the counting unit during a section from a k-th point in time (T(k)) (k indicates a natural number of 1 or more) at which the PWM edge is detected after it is determined that the detection indication signal has been input to a k+1-th point in time (T(k+1)) at which the PWM edge is detected after it is subsequently determined that the detection indication signal has been input.

2. The circuit of claim 1, wherein the counting unit counts a high level maintaining time and a low level maintaining time of the PWM signal and provides a high level count value and a low level count value to the duty calculating unit.

3. The circuit of claim 1, wherein the detection indication determining unit generates an indication detection signal having a preset level when it is determined that the detection indication signal has been input and provides the generated indication detection signal to the duty calculating unit.

4. The circuit of claim 1, wherein the edge detecting unit detects the preset PWM edge of the PWM signal when it is determined that the detection indication signal has been input, and thus generates an edge detection signal having a preset level.

5. The circuit of claim 1, wherein the PWM edge is one of a rising edge and a falling edge of the PWM signal.

6. The circuit of claim 1, wherein the duty calculating unit calculates the duty ratio of the PWM signal using a high level count value and a low level count value provided from the counting unit during the section from the k-th point in time (T(k)) to the k+1-th point in time (T(k+1)).

7. A method for detecting a duty ratio of a PWM signal, the method comprising:
 counting a PWM signal;
 determining whether a detection indication signal indicating a start of detection of the duty ratio of the PWM signal has been input;
 detecting a preset PWM edge of the PWM signal when it is determined that the detection indication signal has been input; and
 calculating the duty ratio of the PWM signal using a count value from the counting of the PWM signal during a section from a k-th point in time (T(k)) (k indicates a natural number of 1 or more) at which the PWM edge is detected to a k+1-th point in time (T(k+1)) at which the next PWM edge is detected.

8. The method of claim 7, wherein in the counting of the PWM signal, a high level maintaining time and a low level maintaining time of the PWM signal are counted, and a high level count value and a low level count value are provided to the calculating of the duty ratio of the PWM signal.

9. The method of claim 7, wherein in the determining, the counting of the PWM signal is performed until it is determined that the detection indication signal has been input, and an indication detection signal having a preset level is generated when it is determined that the detection indication signal has been input and the generated indication detection signal is provided to the calculating of the duty ratio of the PWM signal.

10. The method of claim 7, wherein in the detecting of the preset PWM edge, the counting of the PWM signal is performed until the preset PWM edge of the PWM signal is detected, and an edge detection signal having a preset level is generated when the preset PWM edge of the PWM signal is detected.

11. The method of claim 7, wherein the PWM edge is one of a rising edge and a falling edge of the PWM signal.

12. The method of claim 7, wherein in the calculating of the duty ratio of the PWM signal, the duty ratio of the PWM signal is calculated using a high level count value and a low level count value provided from the counting of the PWM signal during the section from the k-th point in time (T(k)) to the k+1-th point in time (T(k+1)).

* * * * *